United States Patent
Ju et al.

(10) Patent No.: US 11,527,520 B2
(45) Date of Patent: Dec. 13, 2022

(54) MICRO LIGHT EMITTING DIODE DISPLAY DEVICE

(71) Applicant: LG DISPLAY CO., LTD., Seoul (KR)

(72) Inventors: Seong Hwan Ju, Paju-si (KR); Hyeon Ho Son, Paju-si (KR); Jin Yeong Kim, Paju-si (KR); Jung Eun Son, Paju-si (KR); Hanchul Park, Paju-si (KR); Hyunwoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 44 days.

(21) Appl. No.: 16/955,700

(22) PCT Filed: Sep. 20, 2018

(86) PCT No.: PCT/KR2018/011131
§ 371 (c)(1),
(2) Date: Jun. 18, 2020

(87) PCT Pub. No.: WO2019/124684
PCT Pub. Date: Jun. 27, 2019

(65) Prior Publication Data
US 2020/0411492 A1    Dec. 31, 2020

(30) Foreign Application Priority Data
Dec. 18, 2017 (KR) .................. 10-2017-0174482

(51) Int. Cl.
*H01L 31/036* (2006.01)
*H01L 29/15* (2006.01)
(Continued)

(52) U.S. Cl.
CPC ............ *H01L 25/167* (2013.01); *H01L 33/44* (2013.01); *H01L 33/62* (2013.01); *H01L 33/32* (2013.01); *H01L 33/36* (2013.01)

(58) Field of Classification Search
CPC ....... H01L 25/167; H01L 33/44; H01L 33/62; H01L 33/32; H01L 33/36; H01L 25/0753; H01L 27/156; H01L 33/12
See application file for complete search history.

(56) References Cited

U.S. PATENT DOCUMENTS 6,740,884 B2 * 5/2004 Lee .................... H01L 27/14658
250/370.08
9,978,728 B2 * 5/2018 Lin ........................ H01L 25/167
(Continued)

FOREIGN PATENT DOCUMENTS

| CN | 105870265 A | 8/2016 |
| CN | 106898633 A | 6/2017 |

(Continued)

*Primary Examiner* — Ismail A Muse
(74) *Attorney, Agent, or Firm* — Seed IP Law Group LLP

(57) ABSTRACT

The present disclosure relates to a micro light emitting diode (LED) display device including a substrate having a plurality of thin film transistors thereon; a plurality of micro light emitting devices (LEDs) on an upper surface of the substrate, the micro LEDs each having a protecting film provided with a first contact hole to expose a portion of an upper surface of a corresponding micro LED; at least one insulating layer covering the micro LED, the insulating layer provided with a second contact hole to expose a portion of the upper surface of the corresponding micro LED; and a connection electrode in the first contact hole and the second contact hole configured to transfer signals to the micro LED, wherein the first contact hole is larger than the second contact hole.

14 Claims, 7 Drawing Sheets

(51) Int. Cl.
*H01L 29/04* (2006.01)
*H01L 27/14* (2006.01)
*H01L 25/16* (2006.01)
*H01L 33/44* (2010.01)
*H01L 33/62* (2010.01)
*H01L 33/32* (2010.01)
*H01L 33/36* (2010.01)

(56) References Cited

U.S. PATENT DOCUMENTS

| | | |
|---|---|---|
| 2002/0175332 A1 | 11/2002 | Kaneyama et al. |
| 2009/0278142 A1 | 11/2009 | Watanabe et al. |
| 2010/0186883 A1 | 7/2010 | Tomoda |
| 2012/0223345 A1 | 9/2012 | Tomoda et al. |
| 2015/0021613 A1* | 1/2015 | Hayashi .......... H01L 31/022408 257/72 |
| 2015/0362165 A1 | 12/2015 | Chu et al. |
| 2016/0372514 A1 | 12/2016 | Chang et al. |
| 2017/0179097 A1 | 6/2017 | Zhang et al. |
| 2017/0222108 A1 | 8/2017 | Chang et al. |
| 2017/0301724 A1 | 10/2017 | Lee |
| 2018/0190878 A1* | 7/2018 | Li ........................ H01L 33/60 |
| 2019/0074324 A1* | 3/2019 | Kim ................... H01L 27/1218 |
| 2019/0157512 A1* | 5/2019 | Jung ..................... H01L 33/44 |
| 2019/0172761 A1* | 6/2019 | Guo ...................... H01L 33/62 |
| 2019/0378760 A1* | 12/2019 | Lee .................... H01L 33/0095 |
| 2020/0043400 A1* | 2/2020 | Chen ...................... G09G 3/22 |
| 2020/0279975 A1* | 9/2020 | Jung ..................... H01L 33/44 |

FOREIGN PATENT DOCUMENTS

| | | |
|---|---|---|
| CN | 107026124 A | 8/2017 |
| CN | 107393940 A | 11/2017 |
| JP | 2006-278511 A | 10/2006 |
| KR | 10-2008-0029312 A | 4/2008 |
| WO | 2017/142817 | 8/2017 |

* cited by examiner

[Fig. 1]

[Fig. 3]
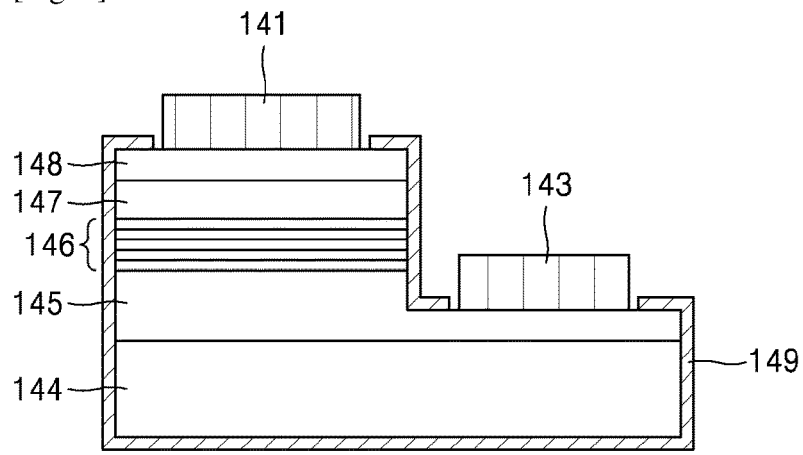
[Fig. 4]
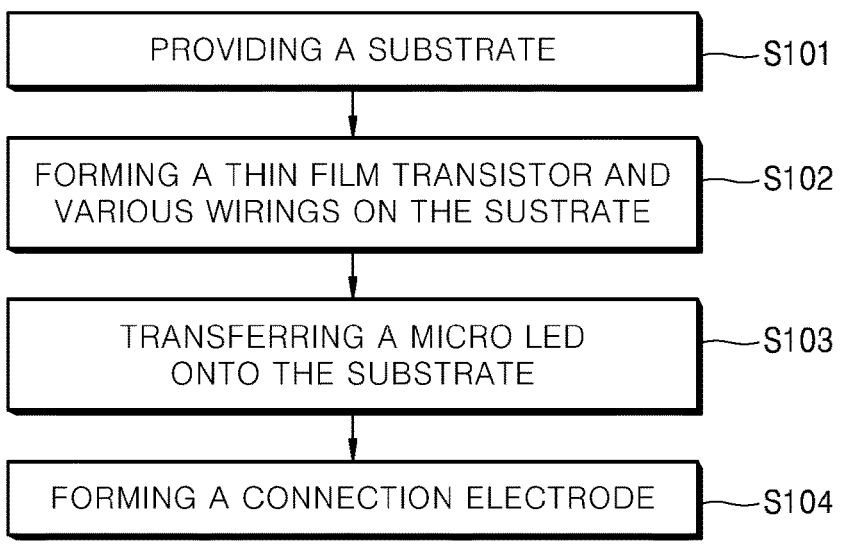
[Fig. 5A]
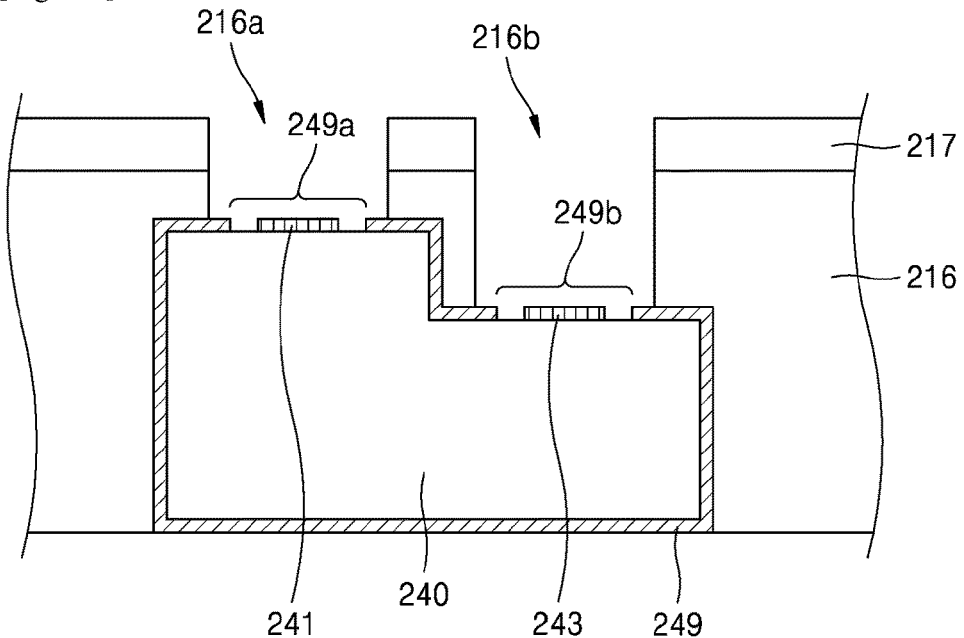

[Fig. 5B]
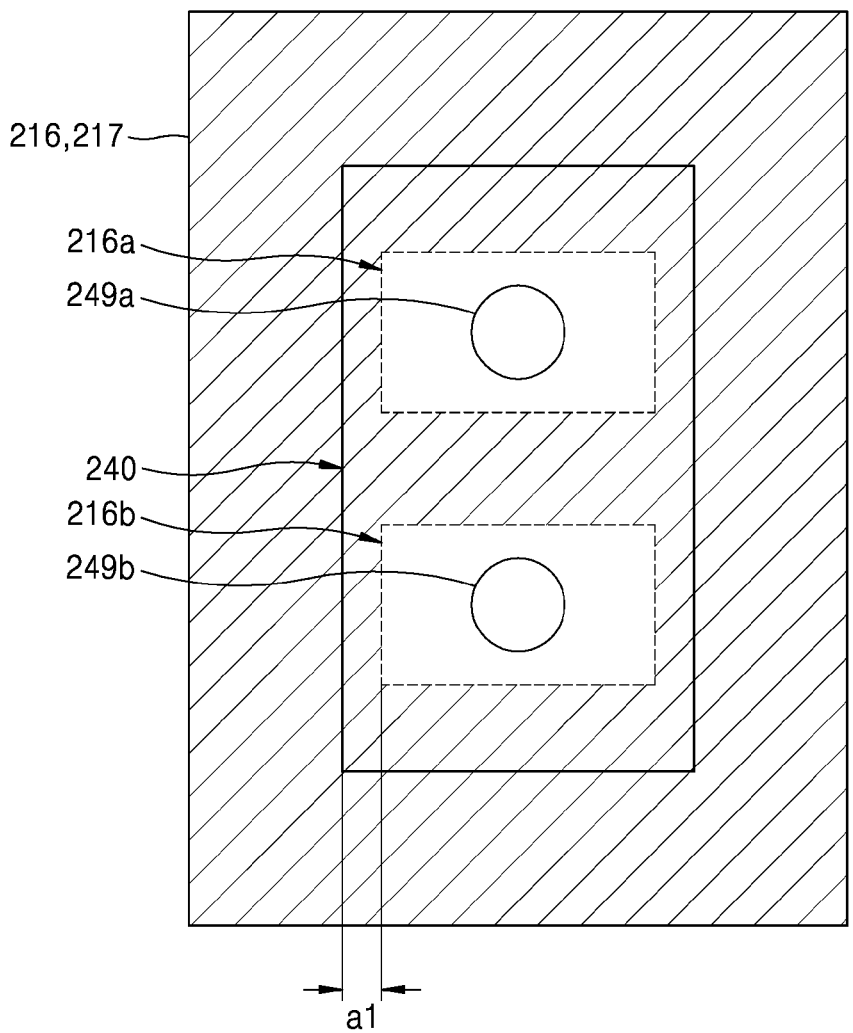
[Fig. 6A]
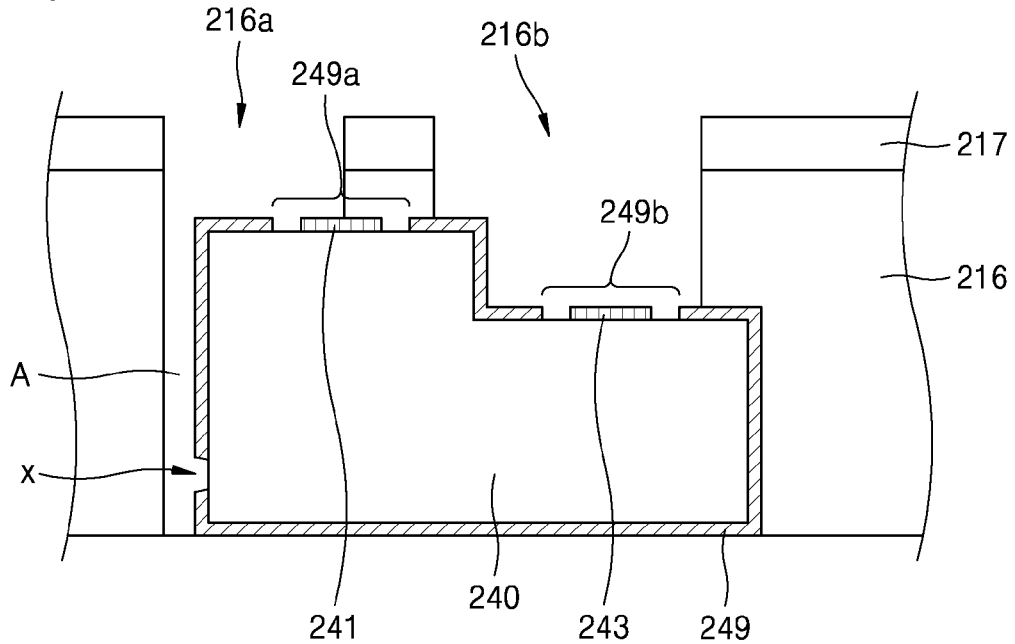

[Fig. 6B]
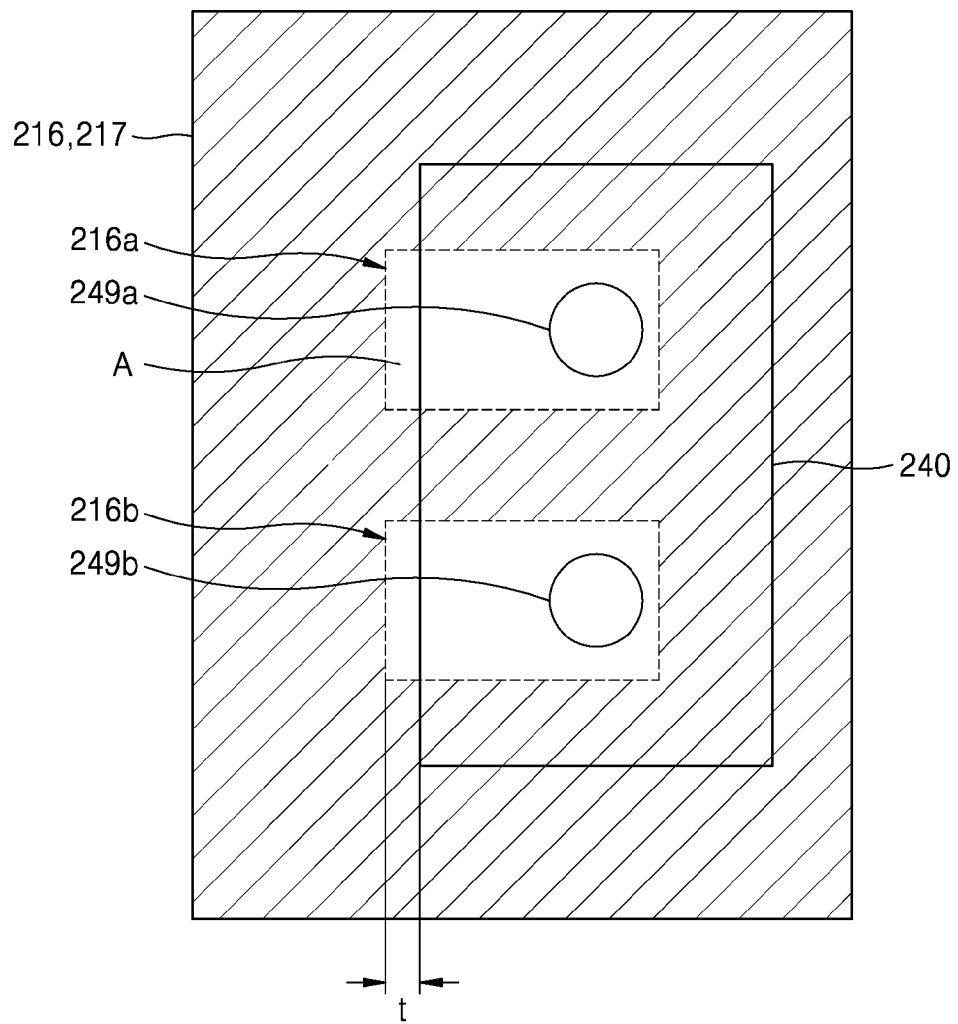
[Fig. 7A]
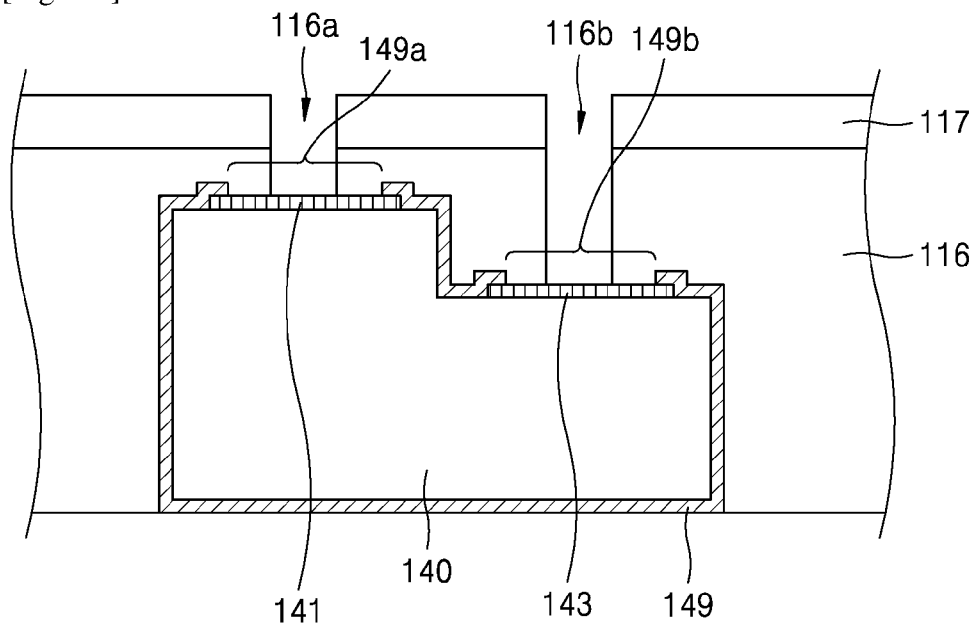

[Fig. 7B]
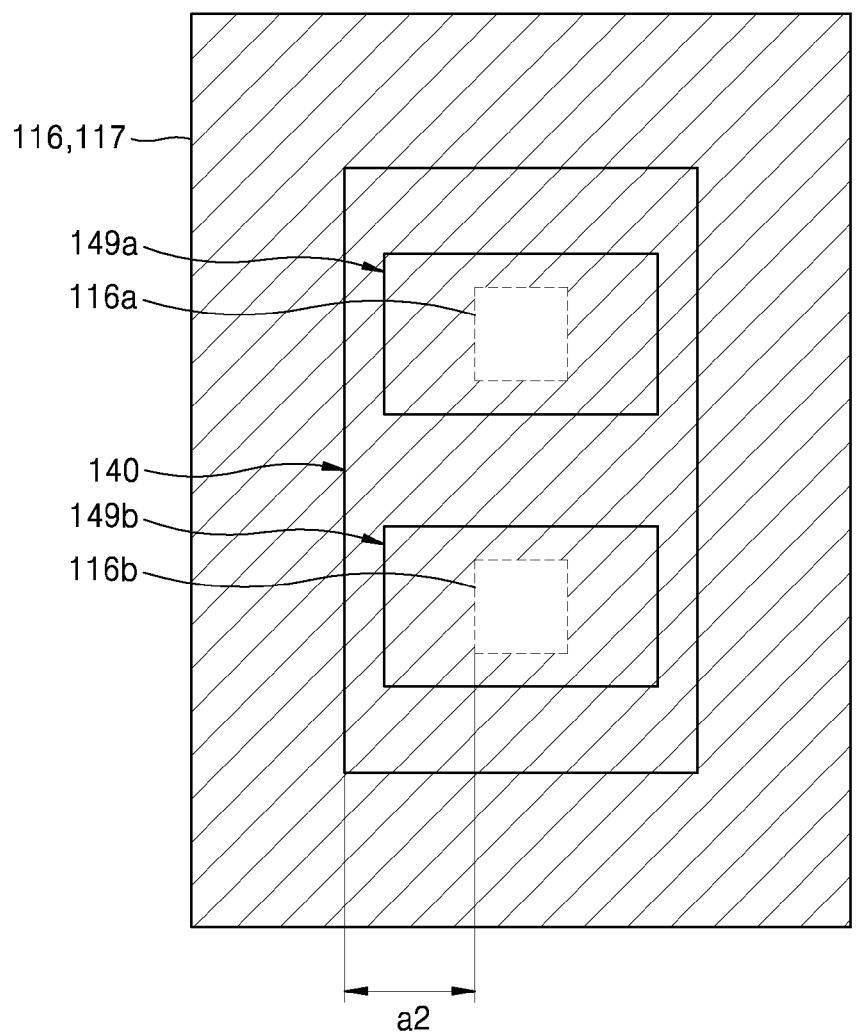
[Fig. 8A]
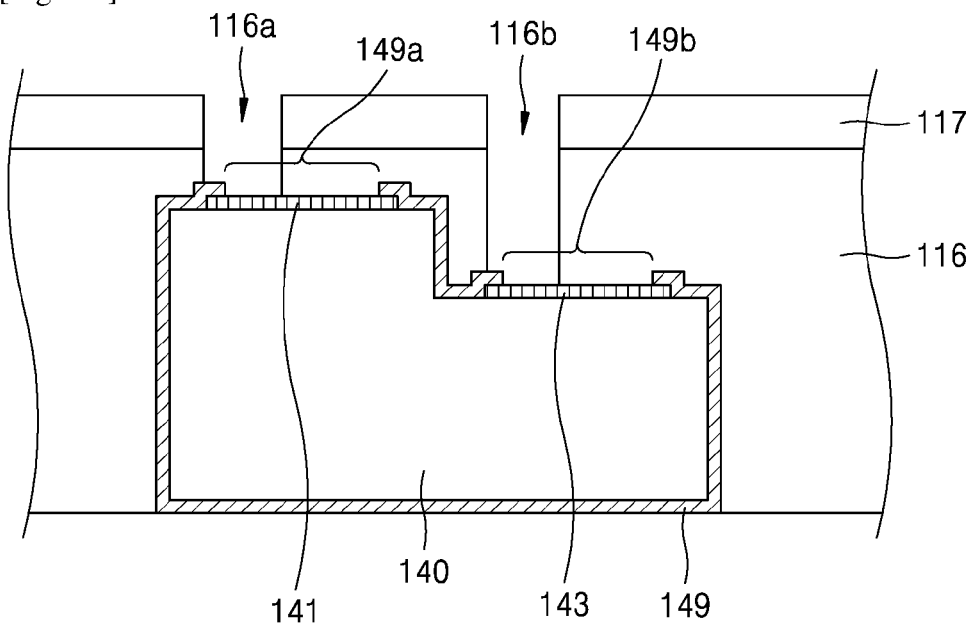

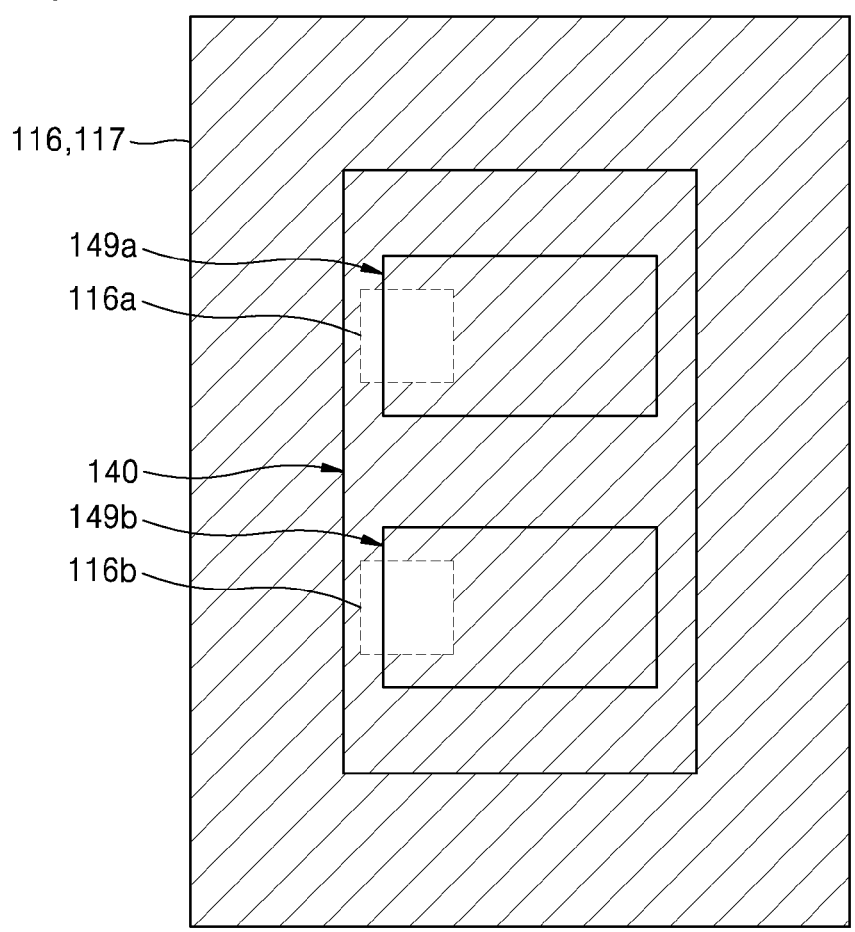
[Fig. 8B]

MICRO LIGHT EMITTING DIODE DISPLAY DEVICE

BACKGROUND

Technical Field

The present disclosure relates to a micro light emitting diode (LED) display device capable of reducing or minimizing transfer defects.

Description of the Related Art

Active studies on an organic material such as a conjugated polymer with conductivity have been conducted since an organic light emitting device using poly (p-phenylenevinylene; PPV) was developed. Also, studies for applying such an organic material to a thin film transistor, a sensor, a laser, a photoelectric device and the like are still ongoing. Especially, studies on an organic electronic light emitting display device are most actively progressing.

An electronic light emitting device composed of phosphor-based inorganic materials may require an AC voltage of 200 V or more as an operating voltage, and a process for manufacturing the device is performed by vacuum deposition. For this reason, it is difficult to enlarge an overall size of the device, it is difficult for the device to emit blue light, and manufacturing costs are too high. However, an electronic light emitting device composed of organic materials exhibits high light emitting efficiency, an overall size thereof can be relatively easily enlarged and its manufacturing process is relatively simple. Especially, it is possible to easily achieve desirable blue light emissions and develop a bendable configuration for the electronic light emitting device. Hence, such an organic electronic light emitting device has emerged as a next-generation display device.

Currently, an active matrix organic electronic light emitting display device including an active driving element provided in each pixel thereof in the same manner as a liquid display device has been actively studied as a flat panel display.

However, the organic electronic light emitting display device has the following problems.

In general, the organic electronic light emitting display device uses a fine metal shadow mask to deposit an organic light emitting layer onto a substrate. But, the process using such a metal shadow mask has a limitation in forming a large area organic electronic light emitting display device. In addition, a metal shadow mask used for a high resolution display device needs to be manufactured at a high resolution, but there is also a limitation in manufacturing such metal shadow mask.

In order to solve these problems, an organic electronic light emitting display device in which a white light emitting element and a color filter are combined has been proposed. Such a white organic electronic light emitting display may reduce an amount of an organic material used, reduce or minimize process time and cost, and may produce high yields. However, the luminance of the white organic electronic light emitting display device is lowered due to light absorption by the color filter, resulting in lowered color purity. In addition, there are limitations in manufacturing a large area display device.

BRIEF SUMMARY

The present disclosure provides a micro LED display device capable of preventing a lighting malfunction caused by a transfer defect.

According to an embodiment of the present disclosure, the micro LED display device includes a substrate having a plurality of thin film transistors thereon; a plurality of micro LEDs provided on the upper surface of the substrate, the micro LEDs each having a protecting film provided with a first contact hole to expose a portion thereof to the outside; at least one insulating layer covering the micro LED, the insulating layer provided with a second contact hole to expose a portion of an upper surface of the micro LED to the outside; and a connection electrode formed in the first contact hole and the second contact hole to transmit an external signal to the micro LED, wherein the first contact hole has a larger area than the second contact hole.

A position of the second contact hole is moved on the upper surface of the micro LED by a transfer error of the micro LED, and the transfer error of the micro LED is allowable up to a region where the first contact hole is exposed through the second contact hole.

According to the embodiment of the present disclosure, a display device is manufactured by transferring the micro LED. Thus, the display device may have a long lifespan and less power consumption in comparison to a liquid display panel or an organic electronic light emitting display panel, and may make implementation of a flexible display device easier.

According to the embodiment of the present disclosure, the contact hole of the protection film of the micro LED is formed to have an larger area than the contact hole of the insulating layer covering the micro LED, such that the insulating layer may always cover the upper surface of the micro LED even when a transfer error occurs due to misalignment. Thus, it is possible to prevent the protective film of the micro LED from being removed by etching gas or chemical agents, thereby preventing a lighting malfunction of the micro LED caused by a short circuit.

According to the embodiment of the present disclosure, a transfer error within the range of a setting distance does not cause the lighting malfunction, thereby greatly increasing an allowable tolerance for transferring the micro LED.

BRIEF DESCRIPTION OF THE SEVERAL VIEWS OF THE DRAWINGS

FIG. 3 is a cross-sectional view showing a structure of a micro LED of FIG. 2.

FIG. 4 is a flow chart showing a method for manufacturing a micro LED display device according to an embodiment of the present disclosure.

FIG. 5A and FIG. 5B show an arrangement structure of a micro LED in a micro LED display device having a general structure.

FIG. 6A and FIG. 6B show an arrangement structure of a micro LED in the case of a transfer error occurring due to misalignment in a micro LED display device having a general structure.

FIG. 7A and FIG. 7B show an arrangement structure of a micro LED in a micro LED display device according to an embodiment of the present disclosure.

FIG. 8A and FIG. 8B show an arrangement structure of a micro LED in the case of a transfer error occurring due to misalignment in a micro LED display device according to an embodiment of the present disclosure.

DETAILED DESCRIPTION

Figure 1:
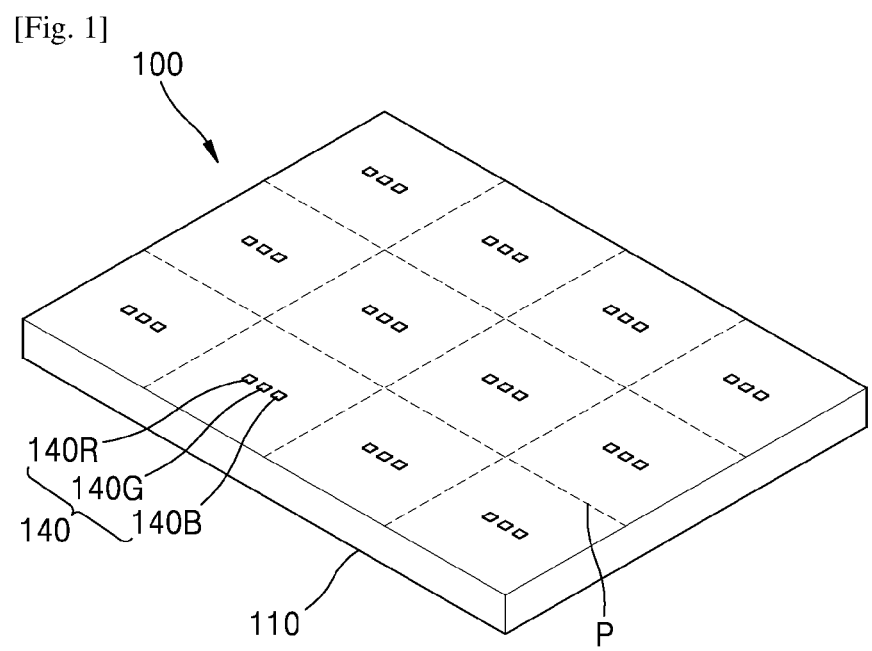
FIG. 1 is a perspective view schematically showing a micro LED display device according to an embodiment of the present disclosure.

Advantages and features of the present disclosure and methods for achieving them will become apparent from the descriptions of embodiments herein below with reference to the accompanying drawings. However, the present disclosure is not limited to the embodiments disclosed herein but may be implemented in various different forms. The embodiments are provided to make the description of the present disclosure thorough and to fully convey the scope of the present disclosure to those skilled in the art.

The shapes, sizes, ratios, angles, the number of elements given in the drawings are merely, and thus, the present disclosure is not limited to the illustrated details. Like reference numerals designate like elements throughout the specification.

In relation to describing the present disclosure, when the detailed description of the relevant known technology is determined to unnecessarily obscure the gist of the present disclosure, the detailed description may be omitted. It is to be noted that the terms "comprising," "having," "including" and the like used in the description and the claims should not be interpreted as being restricted to the means listed thereafter unless specially stated otherwise. Where an indefinite or definite article is used when referring to a singular noun, e.g., "a," "an," "the," this includes a plural of that noun unless specifically stated otherwise.

In relation to interpreting an element, the element is interpreted as including an error range although there is no explicit description.

In relation to describing a positional relationship using phrases such as "element A on element B," "element A above element B," "element A below element B" and "element A next to element B," and the like, another element C may be arranged between the elements A and B unless the term "immediately" or "directly" is explicitly used.

In relation to describing a temporal relationship, terms such as "after," "subsequent to," "next to," "before," and the like may include cases where any two events are not consecutive, unless the term "immediately" or "directly" is explicitly used.

In relation to describing elements, terms such as "first" and "second" are used, but the elements are not limited by these terms. These terms are simply used to distinguish one element from another. Accordingly, as used herein, a first element may be a second element within the technical idea of the present disclosure.

Features of various embodiments of the present disclosure may be partially or fully combined. As will be clearly appreciated by those skilled in the art, technically various interactions and operations are possible. Various embodiments can be practiced individually or in combination.

Hereinafter, the organic electronic light emitting display device according to an embodiment of the present disclosure will be described in detail with reference to the accompanying drawings.

FIG. 1 shows a micro LED display device according to an embodiment of the present disclosure.

As shown in FIG. 1, a micro LED display device 100 according to an embodiment of the present disclosure includes a substrate 110, and a plurality of micro LEDs 140 mounted on the substrate 110.

The substrate 110 may be composed of a transparent material such as glass, and a plurality of pixel regions P are formed on the substrate. Although not shown in the drawings, in some embodiments, the substrate is a thin film transistor (TFT) array substrate, and a TFT and various wirings for driving the micro LED 140 are provided in the pixel regions P of the upper surface thereof. When the TFT is turned on, a driving signal input from the outside through the wirings is applied to the micro LED 140, and then the micro LED 140 emits light to realize an image.

Here, three micro LEDs 140R, 140G and 140B which emit monochromatic lights of red (R), green (G) and blue (B), respectively, are mounted on each of the pixel regions P of the substrate 110. Accordingly, R, G and B lights are emitted from the micro LED 140R, 140G and 140B by the signal applied from the outside to display an image.

The micro LEDs 140R, 140G and 140B are manufactured by a process different from a TFT array process of the substrate 110. In a typical organic electronic light emitting display device, both the TFT array process and organic light emitting layer are formed by a photolithography process, whereas, in the micro LED display device according to the embodiment of the present disclosure, the TFT and various wirings arranged on the substrate are formed by a photolithography process, but the micro LEDs 140R, 140G and 140B are manufactured by a process different from the photolithography process, and the manufactured micro LEDs 140R, 140G and 140B are transferred onto the substrate 110 to create a display device.

The micro LED 140 having a size of 10-100 micrometers (μm) may be formed by growing a plurality of thin films of inorganic materials such as Al, Ga, N, P, As, In and the like on a sapphire substrate or a silicon substrate, and then cutting the sapphire substrate or the silicon substrate. In this manner, the micro LED 140 is formed to have a fine size, and accordingly it may be transferred to a flexible substrate such as a plastic. As such, it is possible to manufacture a flexible display device. Further, unlike the organic light emitting layer, the micro LED 140 is formed by growing a thin film of an inorganic material, and thus a manufacturing process thereof may be simpler, and yield thereof may be improved. Further, each of the micro LEDs 140 separated from one another is simply transferred onto the large area substrate 110, thereby making it possible to manufacture a large area display device. Furthermore, the micro LED 140 composed of inorganic materials have advantages of higher luminance, longer lifespan, and lower costs in comparison to the LED composed of organic light emitting materials.

Although not shown in the drawings, a plurality of gate lines and data lines are arranged on the substrate 110 in vertical (column) and horizontal (row) directions to define the plurality of pixel regions P having a matrix shape. Here, the gate lines and data lines are connected to the micro LED 140, and a gate pad and a data pad connected to the outside are provided at ends of the gate lines and the data lines, respectively. Thus, the external signal is applied to the micro LED 140 through the gate lines and the data lines, and thereby the micro LED 140 is operated to emit light.

Figure 2:
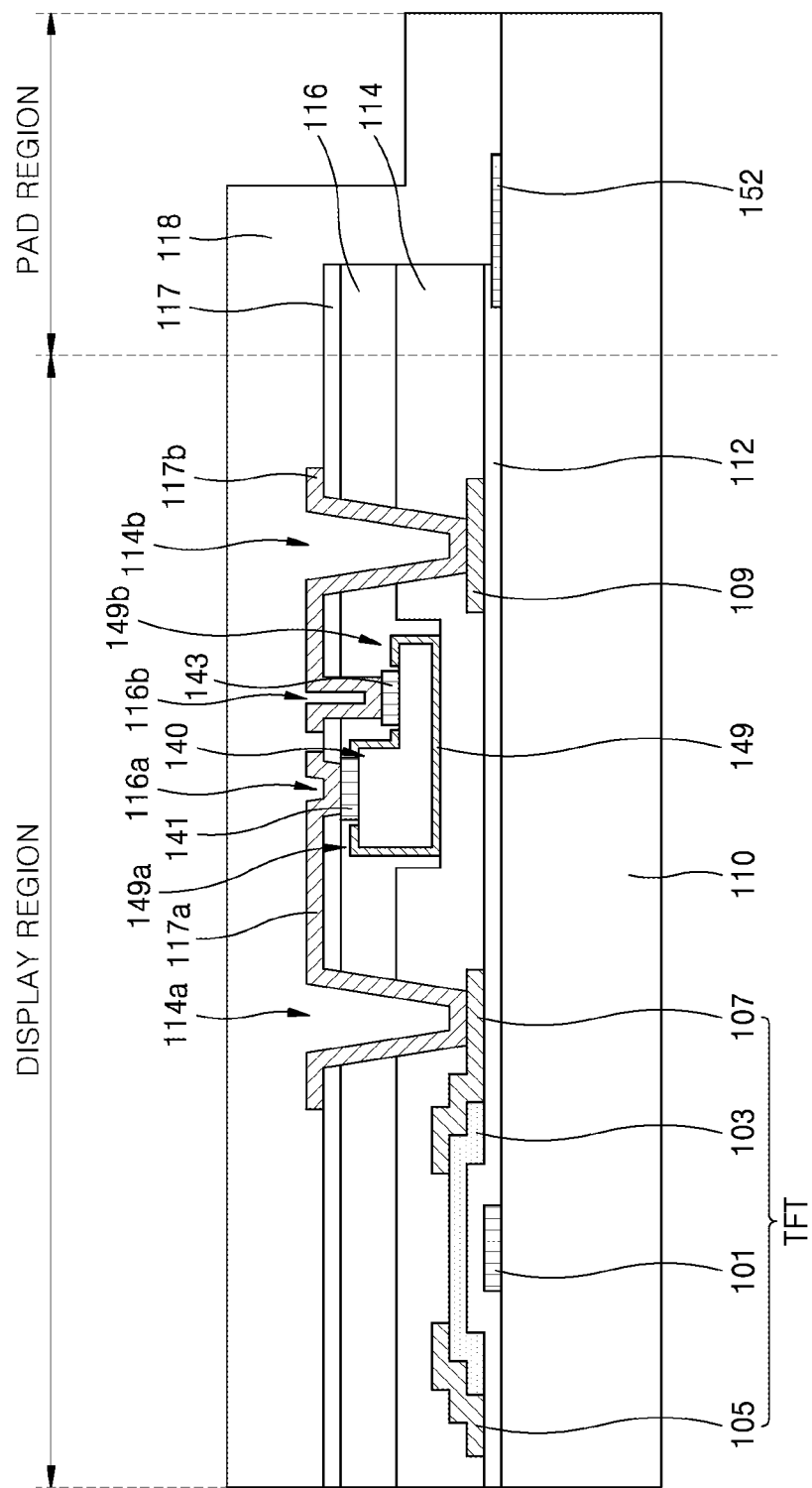
FIG. 2 is a cross-sectional view specifically showing a structure of a micro LED display device according to an embodiment of the present disclosure.

FIG. 2 is a cross-sectional view specifically showing a structure of a micro LED display device 100 according to an embodiment of the present disclosure.

As shown in FIG. 2, the TFT is arranged in a display region of the substrate 110, and a pad 152 is arranged in a pad region. The substrate 110 is composed of a transparent material such as glass, but is not limited thereto. That is, the substrate may be composed of various transparent materials. Also, the substrate 110 may be composed of a flexible transparent material.

The TFT includes a gate electrode 101 formed on the substrate 110, a gate insulating layer 112 formed over the entire region of the substrate 110 to cover the gate electrode 101, a semiconductor layer 103 formed on the gate insulating layer 112, and a source electrode 105 and a drain electrode 107 formed on the semiconductor layer 103.

The gate electrode 101 may be composed of a metal such as Cr, Mo, Ta, Cu, Ti, Al or an Al alloy, or an alloy thereof. In some embodiments, the gate insulating layer 112 may include a single layer composed of an inorganic material such as SiOx or SiNx, or a plurality of layers composed of SiOx and SiNx.

The semiconductor layer 103 may be composed of an amorphous semiconductor such as amorphous silicon or an oxide semiconductor such as IGZO (Indium Gallium Zinc Oxide), $TiO_2$, ZnO, $WO_3$, or $SnO_2$. When the semiconductor layer 103 is composed of the oxide semiconductor, it is possible to reduce a size of the TFT, and improve driving power. As it pertains to this matter, the semiconductor layer of the TFT of the present disclosure is not limited to a particular material, but all types of semiconductor materials for the TFT may be used.

The source electrode 105 and the drain electrode 107 may be composed of a metal such as Cr, Mo, Ta, Cu, Ti, Al or an Al alloy, or an alloy thereof. Here, the drain electrode 107 serves as a first electrode for applying a signal to the micro LED.

Although the drawings illustrate a bottom gate TFT, the present disclosure is not limited to the TFT having such a particular structure, but the TFT having various structures such as a top gate TFT may be applied.

The pad 152 arranged in the pad region may be composed of a metal such as Cr, Mo, Ta, Cu, Ti, Al or an Al alloy, or an alloy thereof. Here, the pad 152 may be formed through a different process from that of the gate electrode 101 of the TFT. But, in order to simplify the process, in some embodiments, it may be preferable to form the pad 152 through the same process as the gate electrode 101.

Although not shown in the drawings, the pad may be formed on the gate insulating layer 112. Here, the pad may be formed through a different process from those of the source electrode 105 and the drain electrode 107 of the TFT, but in order to simplify the process, in some embodiments, it may be preferable to form the pad through the same process as the source electrode 105 and the drain electrode 107.

Further, a second electrode 109 is formed on a gate insulating layer 114 in the display region. Here, the second electrode 109 may be composed of a metal such as Cr, Mo, Ta, Cu, Ti, Al or an Al alloy, or an alloy thereof, and formed through the same process as the first electrode 107 (e.g., the drain electrode of the TFT).

A first insulating layer 114 is formed on the substrate 110 on which the TFT formed, and the micro LED 140 is arranged on the first insulating layer 114 in the display region. Here, the drawings illustrate that a portion of the first insulating layer 114 is removed and the micro LED 140 is arranged in the removed region, but the first insulating layer 114 may not be removed. The first insulating layer 114 may be composed of an organic layer such as photoacryl, an inorganic layer/an organic layer, or an inorganic layer/an organic layer/an inorganic layer.

The micro LED 140 mainly uses a III-V nitride semiconductor material, but is not limited thereto.

FIG. 3 shows a structure of the micro LED 140 in a display device according to an embodiment of the present disclosure. As shown in FIG. 3, the micro LED 140 includes an undoped GaN layer 144, an n type GaN layer 145 arranged on the undoped GaN layer 144, an active layer 146, which has a multi-quantum well (MQW) structure, arranged on the n type GaN layer 145, a p type GaN layer 147 arranged on the active layer 146, an ohmic contact layer 148, which is composed of a transparent conductive material, arranged on the p type GaN layer 147, a p type electrode 141 in contact with a portion of the ohmic contact layer 148, an n type electrode 143 in contact with a portion of the n type GaN layer 145 exposed by partially etching the active layer 146, the p type GaN layer 147 and ohmic contact layer 148, and a protective film 149 formed on a lower surface and a side surface of the micro LED 140, and a portion of a upper surface the micro LED 140.

The n type GaN layer 145 for supplying electrons to the active layer 146 is formed by doping a GaN semiconductor layer with an n type impurity such as Si.

The active layer 146 is a layer in which the injected electrons and holes are combined with each other to emit light. Although not shown in the drawings, the MQW structure of the active layer 146 includes a plurality of barrier layers and well layers alternately arranged. The well layers and the barrier layers are composed of an InGaN layer and a GaN layer, respectively, but are not limited thereto.

The p type GaN layer 147 for injecting holes into the active layer 146 is formed by doping the GaN semiconductor layer with p type impurities such Mg, Zn and Be.

The ohmic contact layer 148 for bringing the p type GaN layer 147 and the p type electrode 141 in ohmic contact with each other may be composed of transparent metal oxides such as indium tin oxide (ITO), indium gallium zinc oxide (IGZO) and indium zinc oxide (IZO).

The p type electrode 141 and the n type electrode 143 may include a single layer or a plurality of layers composed of at least one metal of Ni, Au, Pt, Ti, Al and Cr, or an alloy thereof.

The protective film 149 is formed on a lower surface and a side surface of the GaN layer 144, a side surface of the n type GaN layer 145, the active layer 146 and the p type GaN layer 147, portions of a side surface and an upper surface of the ohmic contact layer 148 and a portion of the etched upper surface of the n type GaN layer 145 to electrically insulate the micro LED 140 in the region excluding the p type electrode 141 and n type electrode 143 from the outside. Here, an inorganic layer and/or an organic layer may be used for the protective film 149.

A fifth contact hole 149a and a sixth contact hole 149b are formed in a region where a portion of the protective film 149 arranged on an upper surface of the micro LED is removed. The p type electrode 141 and the n type electrode 143 are exposed through the fifth contact hole 149a and the sixth contact hole 149b, respectively.

When a voltage is applied to the p type electrode 141 and the n type electrode 143 in the micro LED 140 having such structure, and the electrons and holes are injected from the n type GaN layer 145 and the p type GaN layer 147 into the active layer 146, respectively, and an exciton is produced within the active layer 146. As the exciton is decayed, light corresponding to an energy difference between a lowest unoccupied molecular orbital (LUMO) and a highest occupied molecular orbital (HOMO) of the light emitting layer is generated and emitted to the outside.

Here, a wavelength of the light emitted from the micro LED 140 may be adjusted by adjusting a thickness of a barrier layer having the MQW structure of the active layer 146.

The micro LED 140 is formed to have a size of 10-100 micrometers (μm). Although not shown in the drawings, the micro LED 140 is manufactured by forming a buffer layer on the substrate and growing a GaN thin film on the buffer layer. Here, sapphire, Si, GaN, SiC, GaAs, Zno and the like may be used for the substrate for growing the GaN thin film.

Further, in the case that the substrate for growing the GaN thin film is composed of a material other than a GaN substrate, a lattice mismatch occurs when directly growing the n type GaN layer 145, that is an epi layer, on the substrate. A buffer layer prevents deterioration in quality due to the lattice mismatch. For the buffer layer, AlN or GaN may be used.

The n type GaN layer 145 may be formed by growing a GaN layer 144 undoped with an impurity and then doping an upper portion of the undoped thin film with an n type impurity such as Si. Also, the p type GaN layer 147 may be formed by growing an undoped GaN thin film, and then doping the undoped GaN thin film with p type impurities such as Mg, Zn, Be and the like.

Although the drawings illustrate that the micro LEDs 140 having a particular structure are arranged on the first insulating layer 14, the present disclosure is not limited to the micro LEDs 140 having such particular structure. Rather, the present disclosure may include a micro LED having various structures such as a vertical structure micro LED and a horizontal structure micro LED.

Referring back to FIG. 2, a second insulating layer 116 and a third insulating layer 117 are formed on the first insulating layer 114 on which the micro LED 140 is mounted. Here, the second insulating layer 116 may be composed of an organic layer such as photoacryl, an inorganic layer/an organic layer, or an inorganic layer/an organic layer/an inorganic layer, and covers the upper portion of the micro LED 140. Also, the third insulating layer 117 may be composed of an organic layer, an inorganic layer/an organic layer, or an inorganic layer/an organic layer/an inorganic layer.

Each of the first insulating layer 114, the second insulating layer 116 and the third insulating layer 117 arranged on the upper portions of the TFT and the second electrode 109 is provided with a first contact hole 114a and a second contact hole 114b such that the drain electrode 107 and the second electrode 109 of the TFT are each exposed. Further, each of the second insulating layer 116 and the third insulating layer 117 arranged on the upper portions of the p type electrode 141 and n type electrode 143 of the micro LED 140 is provided with a third contact hole 116a and a fourth contact hole 116b such that the p type electrode 141 and the n type electrode are exposed to the outside.

A first connection electrode 117a and a second connection electrode 117b composed of a transparent metal oxide such as ITO, IGZO, or IGO are formed on the upper portion of the third insulating layer 116. The drain electrode 107 of the TFT and the p type electrode 141 of the micro LED 140 are electrically connected to each other by the first connection electrode 117a through the first contact hole 114a, the third contact hole 116a and the fifth contact hole 149a formed in the protective film 149 of the micro LED 140. The second electrode 109 and the n type electrode 143 of the micro LED 140 are electrically connected to each other by the second connection electrode 117b through the second contact hole 114b, the fourth contact hole 116b and the sixth contact hole 149b.

A buffer layer 118 composed of an inorganic material and/or an organic material is formed on the upper surface of the substrate 110 to cover the upper surfaces of the micro LED 140 and the substrate 110, thereby protecting the micro LED display device from external environment.

In the micro LED display device having such structure, a signal is applied to the pad 152 from the outside, and then the signal is supplied through the gate lines and the data lines to turn on the TFT. When the TFT is turned on, the signal is supplied to the micro LED 140 through the TFT and the second electrode 109, and thereby the micro LED 140 emits light.

As described above, the display device of the present disclosure is manufactured by transferring a plurality of micro LEDs to a display panel 100, and thus it is possible to achieve the following technical benefits.

First, a micro LED display panel is excellent in reliability since it uses an inorganic material, not an organic material, as a light emitting element, and the micro LED display panel has a longer lifespan than a liquid crystal display panel or an organic electronic light emitting display panel.

Second, the micro LED display device of the present disclosure is suitable for application to a super large-sized screen since it is possible to display an image of high luminance with fast lighting speed and low power consumption.

Third, the micro LED display device of the present disclosure has high impact resistance, and thus is excellent in terms of stability.

Fourth, the micro LED display device of the present disclosure includes a very small-sized LED that is a light emitting element, so that the LED may be transferred to a flexible substrate, thereby making implementation of a flexible display device easier.

Fifth, when implementing a tiling display device using a micro LED display panel, the micro LED display device of the present disclosure may arrange LEDs between adjacent panels at the same interval as LEDs arranged in the panel, thereby making it possible to implement zero-bezel in which no virtual bezel region exists.

FIG. 4 is a flowchart showing a method for manufacturing a micro LED display device according to an embodiment of the present disclosure.

As shown in FIG. 4, the substrate 110 composed of a material such as glass or plastic is prepared, and then the TFT and various wirings such as a gate line and a data line are formed on the substrate 110 by a photolithography process (S101, S102).

Subsequently, a wafer such as sapphire or silicon is prepared, and then the n type GaN layer 145, the active layer 146 having the MQW structure, the p type GaN layer 147 and the like are grown on the wafer in a consecutive order by an epitaxial growth method and the like using a metal organic chemical vapor deposition (MOCVD). Next, a plurality of micro LEDs 140 are manufactured by forming the p type electrode 141 and the n type electrode 143, and then the plurality of micro LEDs 140 arranged on the wafer in a state in which the wafer and the substrate 110 are aligned are transferred to each of the pixel regions P of the substrate 110 (S103).

Thereafter, the micro LED 140 and the TFT are connected to each other by forming the first connection electrode 117a and the second connection electrode 117b which are electrically connected to the p type electrode 141 and the n type electrode 143 of the micro LED 140, and finally the micro LED display device is completed (S104).

As described above, the micro LED display device of the present disclosure may be manufactured by making the display panel 100 on which the TFT and various wirings formed separately from the micro LEDs 140, and then transferring the micro LEDs 140 to the display panel 100. That is, the micro LED display device is completed by making the plurality of micro LEDs 140 on the wafer composed of sapphire or silicon and transferring them onto the substrate, or first transferring the micro LEDs 140 arranged on the wafer to a donor substrate, and then second transferring the micro LEDs 140 to the display panel 100 from the donor substrate.

The micro LEDs 140 may be transferred onto the substrate by manufacturing equipment that employs electrostatic force of an electrostatic head or an elastic head composed of a polymer material having elasticity.

As described above, the micro LED display device of the present disclosure is manufactured by making the micro LEDs 140 separately from the display panel 100 and transferring the micro LEDs 140 to the display panel 100. For this reason, the micro LEDs 140 may be manufactured by a relatively low-cost process in comparison to a high-cost photolithography process. Thus, it is possible to reduce the manufacturing cost in comparison to the organic electronic light emitting display device. Also, the micro LED display device of the present disclosure is advantageous in manufacturing a large area display device in comparison to the organic electronic light emitting display device However, such micro LED display device has the following problem. The micro LED 140 is manufactured through a process different from the TFT process of the display panel 100, and then transferred to the display panel 100 by a mechanical method. Thus, a processing error may occur when the display panel 100 of the micro LED 140 is transferred. Due to such processing error, the micro LEDs 140 may not be arranged at their predetermined positions, resulting in defects in the micro LED display device.

The micro LEDs 140 are transferred when the wafer and substrate are aligned. But, the wafer and the substrate 110 may be misaligned, and the micro LEDs 140 may not be arranged at predetermined positions due to a process tolerance, resulting in defects in the micro LED display device.

In order to solve the above-described problem, in the present disclosure, the fifth contact hole 149a and the sixth contact hole 149b formed in the protective film 149 of the micro LED 140 are designed to have a larger area than the third contact hole 116a and the fourth contact hole 116b formed in the second insulating layer 116, respectively, and thereby it is possible to prevent defects in the micro LED display device from occurring even when the wafer and the substrate 110 are misaligned.

Hereinafter, a configuration of the present disclosure which prevents defects in the micro LED display device from occurring even when the wafer and the substrate 110 are misaligned will be described in detail.

FIG. 5A and FIG. 5B show an arrangement structure of a micro LED 240 in a micro LED display device having a general structure, and FIG. 5A is a partial cross-sectional view thereof and FIG. 5B is a partially enlarged plan view thereof.

As shown in FIGS. 5A and 5B, the micro LED 240 includes a protective film 249 formed on a lower surface, a side surface and an upper surface thereof, and a portion of the protective film 249 of the upper surface is removed to form a fifth contact hole 249a and a sixth contact hole 249b. A p type electrode 241 and an n type electrode 243 formed on the micro LED 240 are exposed to the outside through the fifth contact hole 249a and the sixth contact hole 249b, respectively.

Further, the micro LED 240 is partially covered with a second insulating layer 216 and a third insulating layer 217 that is on the second insulating layer 216. The portions of the second insulating layer 216 and the third insulating layer 217 arranged on the upper surface of the micro LED 240 is removed to form a third contact hole 216a and a fourth contact hole 216b which allow the p type electrode 241 and the n type electrode 243 to be exposed to the outside.

Here, the third contact hole 216a and the fourth contact hole 216b in the second insulating layer 216 and the third insulating layer 217 are formed to have a larger area than the fifth contact hole 249a and the sixth contact hole 249b in the protective film 249 of the micro LED 240, respectively, and thereby the fifth contact hole 249a and the sixth contact hole 249b are arranged within the third contact hole 216a and the fourth contact hole 216b, respectively. The third contact hole 216a is spaced apart from a lateral side of the micro LED 240 by a1. Here, the distance ("a1" in FIG. 5B) may be about 2 μm. However, this is merely an example and the range of distance a1 may vary.

As shown in FIGS. 6A and 6B, when the micro LED 240 is displaced by a certain distance in a right direction due to misalignment occurring between the substrate and wafer or between the substrate and the donor substrate at the time the micro LED 240 is transferred, the third contact hole 216a and the fourth contact hole 216b formed in the second insulating layer 216 and the third insulating layer 217 are each positioned at a predetermined position, and only the micro LED 240 is displaced.

When a moving distance of the micro LED 240 due to misalignment of the micro LED 240 is larger than "a1," which is a distance between the third contact hole 216a and the micro LED 240 (for example, the moving distance due to misalignment is 3 μm or more), the lateral side of the micro LED 240 is positioned at a location spaced apart from a wall of the third contact hole 216a by a predetermined distance t, that is, inside the third contact hole 216a, so that a side wall region A of the micro LED 240 is exposed to the outside through the third contact hole 216a.

Meanwhile, the second insulating layer 216 and the third insulating layer 217 are formed by laminating an inorganic layer and/or an organic layer, and portions of the second insulating layer 216 and the third insulating layer 217 are removed to form the third contact hole 216a and the fourth contact hole 216b.

A first connection electrode and a second connection electrode are formed in the third contact hole 216a and the fourth contact hole 216b formed in the second insulating layer 216 and the third insulating layer 217 and in the fifth contact hole 249a and the sixth contact hole 249b formed in the protective film 249 of the micro LED 240. The first connection electrode and the second connection electrode are formed by performing an etching process through an exposure process. Thus, when a process for forming the first connection electrode and the second connection electrode is performed, various chemical agents such as a developing solution, an etchant and the like, act in the third contact hole 216a and the fourth contact hole 216b, and in the fifth contact hole 249a and the sixth contact hole 249b.

In the micro LED display device having a general structure, when the side wall of the micro LED 240 is exposed to the outside through the third contact hole 216a due to misalignment, etching gas acts on the exposed side wall of the micro LED 240 in a process of forming a contact hole, and chemical agents such as a developing solution and an etchant act on the exposed side wall of the micro LED 240 in an etching process. A portion (x) of the protective film 249 of the side wall of the exposed micro LED 240 may be torn out (or damaged) by such etching gas or chemical agents such that the side wall of the micro LED 240 is exposed to the outside through the region x.

Thus, a metal layer is formed on the side wall of the micro LED 240 exposed through the third contact hole 216a when the first connection electrode and the second connection electrode are formed, and the micro LED 240 is short circuited with the first connection electrode by the metal layer, resulting in a lighting malfunction in the corresponding micro LED 240.

In order to prevent a lighting malfunction of the micro LED 140 due to misalignment of the wafer and substrate, in the present disclosure, the third contact hole 116a and the fourth contact hole 116b formed in the second insulating layer 116 and the third insulating layer 117 are designed to have a different shape from the fifth contact hole 149a and the sixth contact hole 149b formed in the protective film of the micro LED 140, respectively, such that a lighting malfunction is not caused by a short circuit of the micro LED 140 even when the micro LED 140 is displaced by a certain distance from a predetermined position due to misalignment.

FIG. 7A and FIG. 7B show an arrangement structure of micro LEDs 140 in a micro LED display device according to an embodiment of the present disclosure, and FIG. 7A is a partial cross-sectional view thereof and FIG. 7B is a partial plan view thereof.

As shown in FIGS. 7A and 7B, the micro LED 140 includes a protective film 149 formed on a lower surface, a side surface and an upper surface thereof, and a portion of the protective film 149 is removed to form a fifth contact hole 149a and a sixth contact hole 149b. The p type electrode 141 and the n type electrode 143 are exposed to the outside through the fifth contact hole 149a and the sixth contact hole 149b, respectively. Here, the p type electrode 141 and the n type electrode 143 may be formed to have a larger area than the fifth contact hole 149a and the sixth contact hole 149b, respectively. In this case, the p type electrode 141 and the n type electrode 143 are formed on the entire region exposed by the fifth contact hole 149a and the sixth contact hole 149b.

Also, the p type electrode 141 and the n type electrode 143 are formed to have a smaller area than the fifth contact hole 149a and the sixth contact hole 149b, respectively, and thereby the p type electrode 141 and the n type electrode 143 may be arranged on a portion of the upper surface of the micro LED 140 exposed by the fifth contact hole 149a and the sixth contact hole 149b.

The micro LED 140 is covered with a first insulating layer 116 and a third insulating layer 117, and portions of the first insulating layer 116 and the third insulating layer 117 arranged on the upper surface of the micro LED 140 is removed such that the third contact hole 116a and the fourth contact hole 116b which allow the p type electrode 241 and the n type electrode 243 to be exposed to the outside are formed on the first insulating layer 116 and third insulating layer 117.

Although the drawings illustrate the fifth contact hole 149a and the sixth contact hole 149b configured to have a square shape and the third contact hole 116a and the fourth contact hole 116b configured to have a square shape, the third contact hole 116a, the fourth contact hole 116b, the fifth contact hole 149a and the sixth contact hole 149b may be configured to have various shapes such as a circular shape or a square shape, and are not limited to a particular shape. Further, a shape of the third contact hole 116a and the fourth contact hole 116b may be the same as or different from that of the fifth contact hole 149a and the sixth contact hole 149b.

Here, the third contact hole 116a and the fourth contact hole 116b are formed to have a smaller area than the fifth contact hole 149a and the sixth contact hole 149b, respectively, and thereby the third contact hole 116a and the fourth contact hole 116b are arranged in the fifth contact hole 149a and the sixth contact hole 149b, respectively. Since the entire region exposed by the fifth contact hole 149a and the sixth contact hole 149b is composed of the p type electrode 141 and the n type electrode 143, the third contact hole 116a, the entire region exposed by the third contact hole 116a and the fourth contact hole 116b is composed of the p type electrode 141 and the n type electrode 143. Here, the third contact hole 116a is spaced apart from a lateral side of the micro LED 140 by a distance (a2), and the distance (a2) may be about 6 μm.

As shown in FIG. 8A and FIG. 8B, when the micro LED 140 is displaced by a certain distance in a right direction due to misalignment occurring between the substrate 110 and wafer or the substrate 110 and the donor substrate at the time the micro LED 140 is transferred, the third contact hole 116a and the fourth contact hole 116b formed in the second insulating layer 116 and the third insulating layer 117 are each arranged at a predetermined position, and only the micro LED 140 is displaced.

In the present disclosure, the third contact hole 116a and the fourth contact hole 116b each have a smaller size, and the fifth contact hole 149a and the sixth contact hole 149b each have a larger size than those of a general structure, and thus the fifth contact hole 149a and the sixth contact hole 149b have a larger area than the third contact hole 116a and the fourth contact hole 116b. As a result, a distance (a2) between the third contact hole 116a and the lateral side of the micro LED 140 is greater than that of the general structure (a2>a1). For example, a distance (a1) between the third contact hole 216a and the lateral side of the micro LED 240 in the micro LED display device having a general structure is 2 μm, whereas a distance (a2) between the third contact hole 116a and the micro LED 140 of the micro LED display device of the present disclosure may be 6 μm.

When the moving distance of the micro LED 140 due to misalignment of the micro LED 140 is greater than a1 which is a distance between the third contact hole 216a and the micro LED 240 having a general structure, but is shorter than a2 (for example, the moving distance due to misalignment is more than 2 μm, and less than 6 μm), the third contact hole 116a may remain positioned on the upper surface of the micro LED 140. In other words, the side wall of the micro LED 140 is covered with the second insulating layer 116 and the third insulating layer 117 and is not exposed to the outside.

Thus, when performing the etching process of the second insulating layer 116 and the third insulating layer 117, and the process for forming the first connecting electrode 117a and the second connecting electrode 117b, the protective film 149 of the micro LED 140 is not affected by etching gas, chemical agents and the like, thereby preventing a lighting malfunction due to a short circuit of the micro LED 140.

The area of the fifth contact hole 149a and the sixth contact hole 149b increases so that the fifth contact hole 149a and the sixth contact hole 149b occupy a large area of the upper surface of the micro LED 140. And, the entire region exposed by the fifth contact hole 149a and the sixth contact hole 149b is composed of the p type electrode 141 and the n type electrode 143, respectively. For this reason, despite misalignment between the substrate 110 and the wafer, the p type electrode 141 and the n type electrode 141 are exposed through the third contact hole 116a and the fourth contact hole 116b arranged on the upper surface of the micro LED 140, thereby preventing a malfunction in electrical connection between the p type electrode 141 and the n type electrode 143, and between the first connection electrode 117a and the second connection electrode 117b.

In this regard, a transfer error of the micro LED (a2: a distance between a predetermined position and an actual position of the micro LED due to misalignment) would be a distance to the position at which the fifth contact hole 149a and the sixth contact hole 149b are not exposed through the third contact hole 116a and the fourth contact hole 116b, that is, a distance to the position at which the p type electrode 141 and n type electrode 146 are not exposed.

In the present disclosure, since a transfer error within a range of a predetermined distance does not cause a lighting malfunction, an allowable tolerance for the transferring the micro LED may be greatly increased in comparison to that of the conventional structure.

The present disclosure described as above is not limited by the embodiments described herein and accompanying drawings. It should be apparent to those skilled in the art that various substitutions, changes and modifications which are not exemplified herein but are still within the scope of the present disclosure may be made. The embodiments should be considered in descriptive sense only and not for purposes of limitation. All differences within the scope of the technical idea of the present disclosure will be construed as being included in the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro light emitting diode (LED) display device, comprising:
   a substrate;
   a plurality of thin film transistors on the substrate;
   a plurality of micro light emitting diodes (LEDs) on an upper surface of the substrate, each of the plurality of micro LEDs including:
      a protective film; and
      a first contact hole provided in the protective film, wherein the first contact hole exposes a portion of an upper surface of a corresponding micro LED;
   at least one insulating layer covering the micro LEDs, the insulating layer having a second contact hole to expose the portion of the upper surface of the corresponding micro LED;
   a connection electrode in the first contact hole and the second contact hole configured to transfer signals to the micro LED; and
   an electrode on the micro LED exposed by the first contact hole and the second contact hole to permit an external signal to be applied to the electrode through the connection electrode,
   wherein the first contact hole is larger than the second contact hole, and
   wherein the first contact hole and the second contact hole are substantially aligned with each other.

2. The micro LED display device according to claim 1, wherein the micro LED has a size of 10-100 micrometers (μm).

3. The micro LED display device according to claim 1, wherein a position of the second contact hole is spaced apart from the upper surface of the micro LED to a selected distance due to a transfer error of the micro LED.

4. The micro LED display according to claim 3, wherein the transfer error of the micro LED is allowable up to a region where the first contact hole is exposed through the second contact hole.

5. The micro LED display device according to claim 1, wherein the first contact holes have either a circular or rectangular shape.

6. The micro LED display device according to claim 1, wherein the second contact holes have either a circular or rectangular shape.

7. The micro LED display device according to claim 1, wherein the micro LED has a dimension in the order of micrometers (μm).

8. The micro LED display device according to claim 1, wherein the second contact hole overlaps with the first contact hole.

9. A micro light emitting diode display device, comprising:
   a substrate;
   a thin film transistor on the substrate;
   a micro light emitting diode on the substrate and spaced apart from the thin film transistor, the micro light emitting diode having a lower surface, an upper surface, and a side surface between the lower surface and the upper surface;
   a protective film fully surrounding the micro light emitting diode except a partial upper portion of the micro light emitting diode, wherein the protective film is continuously connected on the lower surface and the side surface of the micro light emitting diode, and having contact holes on the upper surface of the micro light emitting diode;
   a first contact hole located in a portion of the protective film and exposing the partial upper portion of the micro light emitting diode;
   a first electrode on the first contact hole; and
   a connection electrode connecting the first electrode in the first contact hole and the thin film transistor.

10. The micro light emitting diode display device according to claim 9, wherein the first electrode is directly on and contacting the micro light emitting diode and at least a portion of the protective film is directly on and contacting the micro light emitting diode,
   wherein the first electrode overlaps with the protective film at an end of the first electrode.

11. The micro light emitting diode display device according to claim 9, further comprising an insulating layer covering the micro light emitting diode, the insulating layer having a second contact hole to expose the portion of an upper surface of a corresponding micro light emitting diode, wherein the first contact hole is larger than the second contact hole.

12. A micro light emitting diode (LED) display device, comprising:
   a substrate;
   a thin film transistor and a micro light emitting diode on the substrate, the micro light emitting diode having a lower surface, an upper surface, and a side surface between the lower surface and the upper surface;

a protective film fully surrounding the micro light emitting diode except a partial upper portion of the micro light emitting diode, wherein the protective film is continuously connected on the lower surface and the side surface of the micro light emitting diode, and having contact holes on the upper surface of the micro light emitting diode;

a first contact hole located in a portion of the protective film and exposing the partial upper portion of the micro light emitting diode;

an insulating layer covering the micro light emitting diode except a partial upper portion of the micro light emitting diode; and a second contact hole located in a portion of the insulating layer and exposing the partial upper portion of the micro light emitting diode, wherein the first contact hole is larger than the second contact hole.

13. The micro light emitting diode display device according to claim 12, a shape of the first contact hole is different from a shape of the second contact hole.

14. The micro light emitting diode display device according to claim 12, a shape of the first contact hole is same as a shape of the second contact hole.

* * * * *

UNITED STATES PATENT AND TRADEMARK OFFICE
CERTIFICATE OF CORRECTION

| | | |
|---|---|---|
| PATENT NO. | : 11,527,520 B2 | Page 1 of 1 |
| APPLICATION NO. | : 16/955700 | |
| DATED | : December 13, 2022 | |
| INVENTOR(S) | : Seong Hwan Ju et al. | |

It is certified that error appears in the above-identified patent and that said Letters Patent is hereby corrected as shown below:

In the Claims

Column 14, Claim 4, Line 8:
"LED display according to"
Should read:
--LED display device according to--.

Signed and Sealed this
Ninth Day of July, 2024

Katherine Kelly Vidal
*Director of the United States Patent and Trademark Office*